US006961247B2

(12) United States Patent
Tomsio et al.

(10) Patent No.: US 6,961,247 B2
(45) Date of Patent: Nov. 1, 2005

(54) POWER GRID AND BUMP PATTERN WITH REDUCED INDUCTANCE AND RESISTANCE

(75) Inventors: Nayon Tomsio, Austin, TX (US); Steven A. Schmidt, Leander, TX (US); Linda S. Whitney, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 423 days.

(21) Appl. No.: 10/184,289

(22) Filed: Jun. 27, 2002

(65) Prior Publication Data

US 2004/0001326 A1 Jan. 1, 2004

(51) Int. Cl.[7] .............................................. H01R 9/00
(52) U.S. Cl. ...................................... 361/775; 361/774
(58) Field of Search ............................... 361/774–775; 257/690–691

(56) References Cited

U.S. PATENT DOCUMENTS 6,160,298 A * 12/2000 Ohkubo ...................... 257/393
6,305,000 B1 * 10/2001 Phan et al. ...................... 716/5
6,308,307 B1 * 10/2001 Cano et al. ...................... 716/8
6,410,990 B2 * 6/2002 Taylor et al. ................ 257/786
6,483,714 B1 * 11/2002 Kabumoto et al. ......... 361/760

* cited by examiner

Primary Examiner—Kamand Cuneo
Assistant Examiner—Tuan Dinh
(74) Attorney, Agent, or Firm—Blakely Sokoloff Taylor & Zafman LLP

(57) ABSTRACT

Disclosed are novel methods and apparatus for efficiently providing power buses and bump patterns with reduced inductance and/or resistance. In an embodiment, an apparatus is disclosed. The apparatus includes a plurality of power and ground bus pairs. Each power and ground bus pair may have a power bus and a ground bus. The apparatus further includes a first power bus from a first pair of the plurality of power and ground bus pairs. The first power bus may include a plurality of power bumps. The apparatus also includes a first ground bus from the first pair of the plurality of power and ground bus pairs. The first ground bus may include a plurality of ground bumps. Each of the plurality of power/ground bumps may be substantially equidistance from any immediately neighboring ground bump of the first ground bus.

28 Claims, 4 Drawing Sheets

POWER GRID AND BUMP PATTERN WITH REDUCED INDUCTANCE AND RESISTANCE

FIELD OF INVENTION

The present invention generally relates to power distribution in integrated circuits (ICs). More specifically, an embodiment of the present invention relates to a low inductance and resistance power bus and bump pattern.

BACKGROUND OF INVENTION

As the functionality requirements of today's electronic products increase, the IC designs associated with these products also become increasingly more complicated. Examples of such IC designs include very large-scale integration (VLSI) circuits such as microprocessor chips (including those provided by Sun Microsystems, Inc., of Palo Alto, Calif.). As these designs become more compact, in part, to incorporate additional functionality in the same floor space, voltage variations at the transistor level quickly become a significant problem for designers. More specifically, a challenging issue facing today's IC designers is reducing direct current (DC) and alternating current (AC) voltage variations at the transistors of IC chips.

In AC voltage variations, the voltage variation is directly proportional to inductance and rate of current variation. Thus, as the current swings increase, so do the voltage variations. Large current swings may result, for example, from clock-gating (i.e., turning off/on) various blocks in a chip, high switching instruction and data patterns, and wide instruction and data buses. In DC voltage variations, the voltage variation is generally directly proportional to the resistance of a given path. Thus, as the resistance in a path increases, so does the voltage drop in that path.

Accordingly, problems associated with the prior art include increased power consumption and decreased performance due in part to unstable and/or unpredictable voltage levels at transistors of a chip. Also, having an unstable and/or unpredictable voltage at the transistor level may decrease the reliability of a chip.

Another issue facing today's IC designers is that the current bump placement techniques may require that bumps be located over alpha sensitive circuitry because nearly all bumps contain lead, which omits alpha particles. This is highly undesirable because alpha particles can interfere with the operation of an IC.

FIG. 1 illustrates an exemplarily cross-sectional view of a power grid 100 in accordance with the prior art. A first power bus 102 has bumps 104*a*, 104*b*, and 104*c* thereon. A ground bus 106 has bumps 108*a*, 108*b*, and 108*c* thereon. A second power bus 110 includes bumps 112*a*, 112*b*, and 112*c*. As illustrated in FIG. 1, the ground bus 106 may be located between the first power bus 102 and the second power bus 110. Alternatively, a power bus may be located between two ground buses (not shown). As illustrated in FIG. 1, bumps from different buses are substantially aligned. For example, the bump 104*a* is aligned with bumps 108*a* and 112*a*.

SUMMARY OF INVENTION

The present invention provides novel methods and apparatus for reducing DC and/or AC voltage variations at the transistor level of IC chips, in part, by creating novel power and ground bump patterns and/or novel power and ground grids. In an embodiment, these patterns and grids may be located at the top metal layer of an IC, which attaches to bumps. In another embodiments, the novel power and ground bump patterns and/or novel power and ground grids may be referred to as low resistance, low inductance power structures (LRLIPSs). In yet another embodiment, the LRLIPS may reduce the resistance and/or inductance of the power and ground grid of a VLSI design.

In a further embodiment, an apparatus is disclosed. The apparatus includes a plurality of power and ground bus pairs. Each power and ground bus pair may have a power bus and a ground bus. Each bus within each power and ground bus pair may be closer in distance to each other than to a bus from a different power and ground bus pair. The apparatus further includes a first power bus from a first pair of the plurality of power and ground bus pairs. The first power bus may include a plurality of power bumps. The apparatus also includes a first ground bus from the first pair of the plurality of power and ground bus pairs. The first ground bus may include a plurality of ground bumps. Each of the plurality of power bumps may be substantially equidistance from any immediately neighboring ground bump of the first ground bus. Also, each of the plurality of ground bumps may be substantially equidistance from any immediately neighboring power bump of the first power bus.

BRIEF DESCRIPTION OF DRAWINGS

The present invention may be better understood and its numerous objects, features, and advantages made apparent to those skilled in the art by reference to the accompanying drawings in which.

The use of the same reference symbols in different drawings indicates similar or identical items.

DETAILED DESCRIPTION

In the following description, numerous details are set forth. It will be apparent, however, to one skilled in the art that embodiments of the invention may be practiced without these specific details. In other instances, well-known structures, devices, and techniques have not been shown in detail, in order to avoid obscuring the understanding of the description. The description is thus to be regarded as illustrative instead of limiting.

Reference in the specification to "one embodiment" or "an embodiment" means that a particular feature, structure, or characteristic described in connection with the embodiment is included in at least an embodiment of the invention. The appearances of the phrase "in one embodiment" in various places in the specification are not necessarily all referring to the same embodiment.

Figure 1:
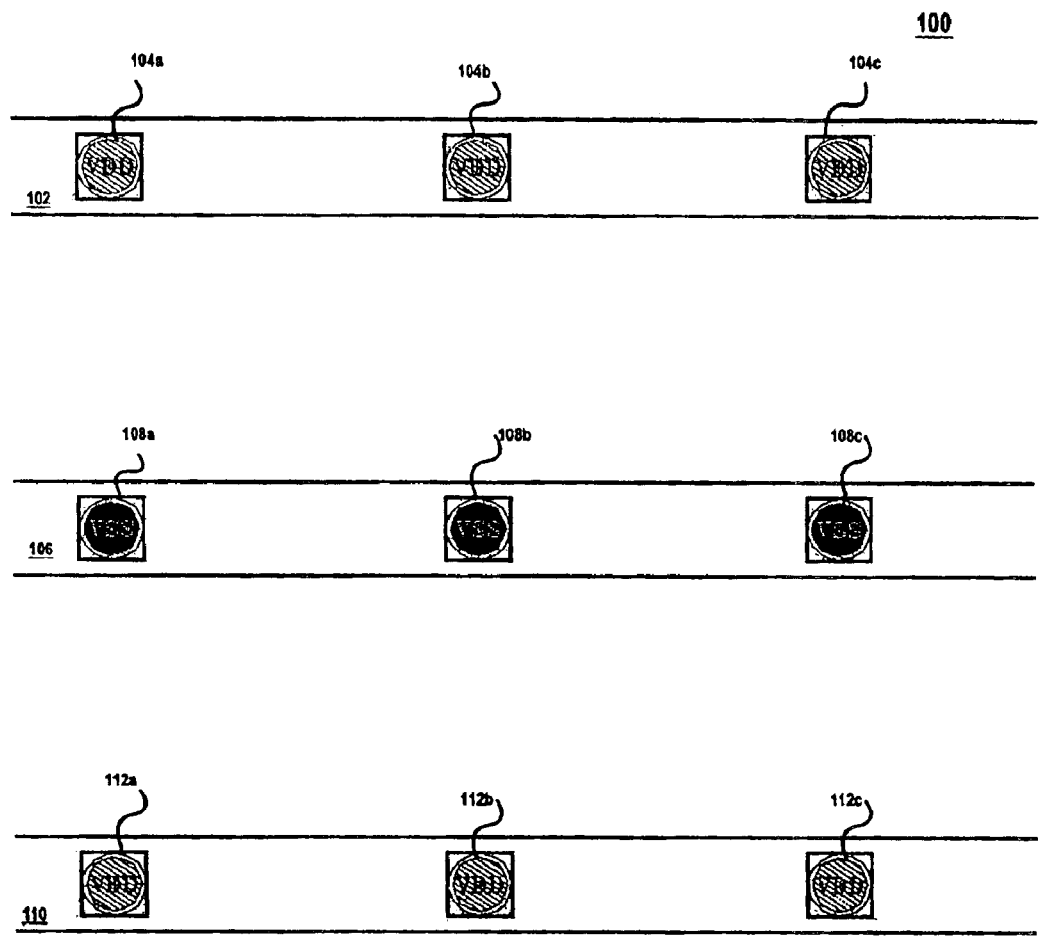
FIG. 1 illustrates an exemplarily cross-sectional view of a power grid 100 in accordance with the prior art.
Figure 2:
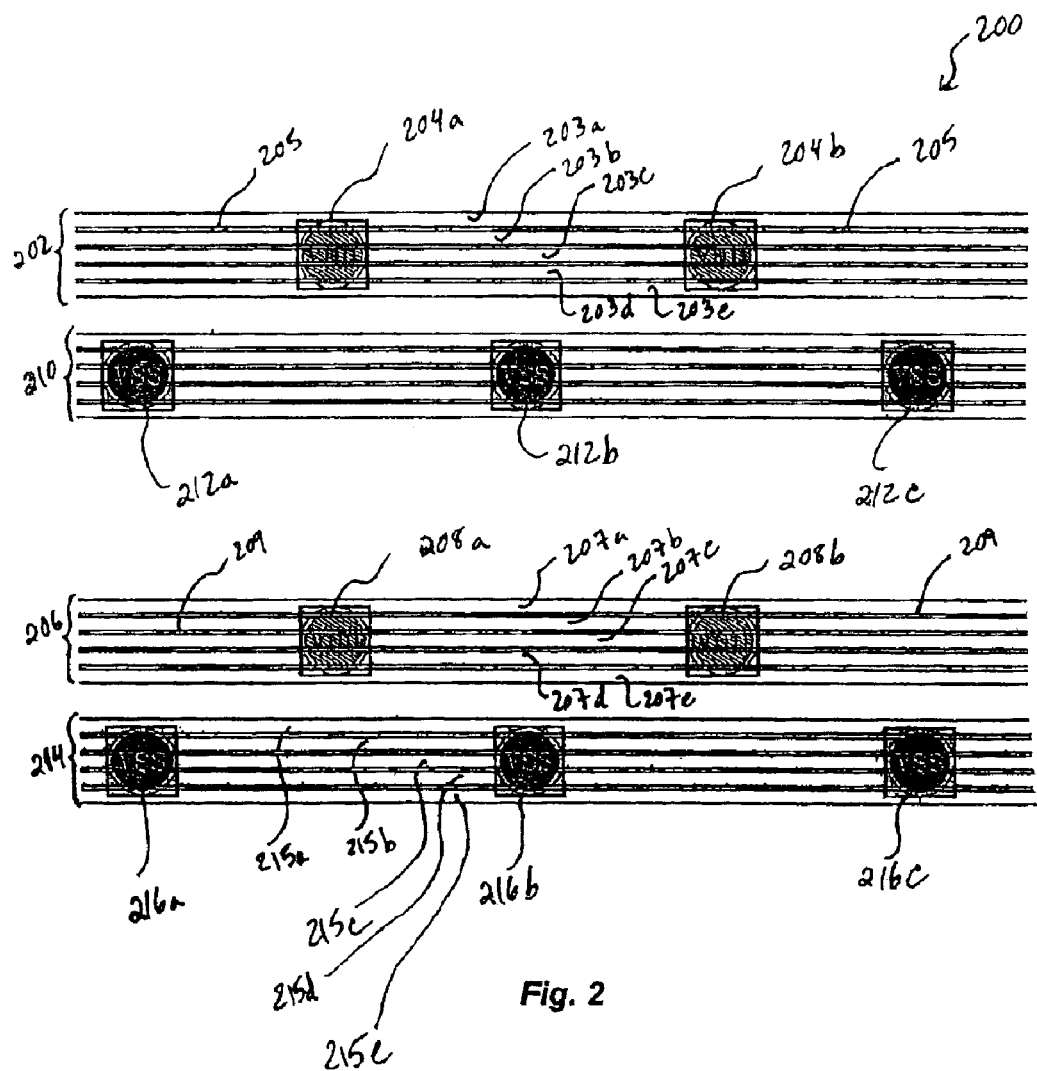
FIG. 2 illustrates a cross-sectional view of a power grid 200 in accordance with an embodiment of the present invention.

FIG. 2 illustrates an exemplarily cross-sectional view of a power grid 200 in accordance with an embodiment of the present invention. The power grid 200 includes a first power bus 202 and a second power bus 206 each having wires 203*a–e* and 207*a–e*, respectively. In an embodiment, the wires within each set of wires (203*a–e* and 207*a–e*) may be separated with any type of dielectric. As illustrated, in accordance with one embodiment, the wires (e.g., 203a–e and 207a–e) may be electrically coupled by, for example, utilizing connectors 205 and 209 (shown throughout wires 203a–e and 207a–e, respectively). In an embodiment, it is envisioned that these connectors (e.g., 205 and/or 209) may be an integral part of the wires (e.g., 203a–e and/or 207a–e), instead of a separate structure. In one embodiment, the wires (e.g., 203a–e and/or 207a–e) and/or connectors (e.g., 205 and/or 209) may be constructed utilizing the same material. In an embodiment, the wires (e.g., 203a–e and/or 207a–e) and/or connectors (e.g., 205 and/or 209) may be constructed by using material selected from a group including copper, aluminum, silver, gold, other types of conductive substances, and/or any combination thereof.

The first and second power buses (202 and 206) each have bumps 204a–b and 208a–b, respectively. The power grid 200 further includes a first ground bus 210 and a second ground bus 214 each having bumps 212a–c and 216a–c, respectively. In one embodiment, any pair of adjacent power and ground buses may be as close to each other as possible without causing a short. It is envisioned that the distance between adjacent power and ground buses may depend on the technology utilized to implement the circuitry. For example, the minimum distance between adjacent power and ground buses may be 30 microns in one technology and 10 in another.

Figure 4:
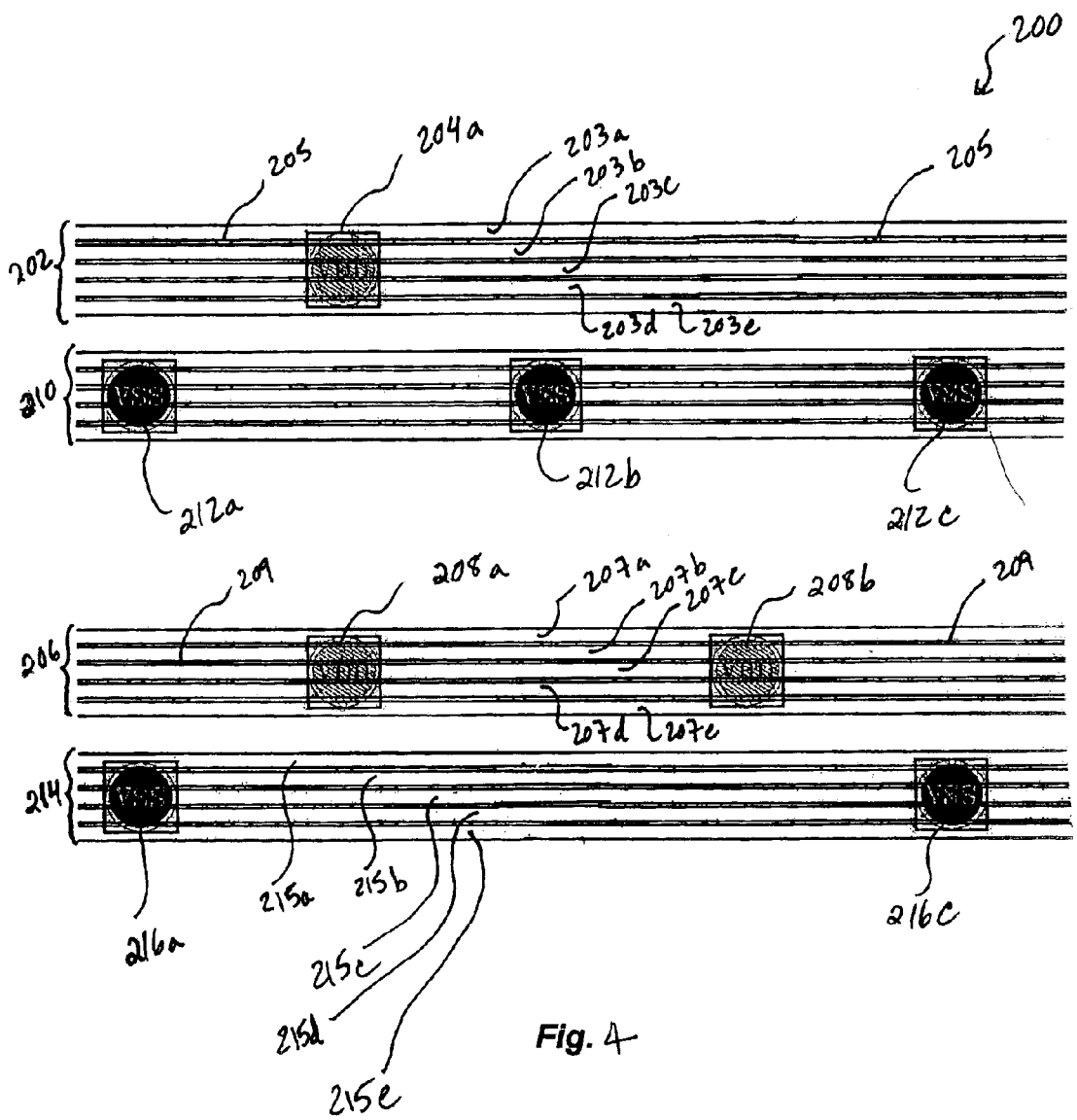
FIG. 4 illustrates another embodiment of a cross-sectional view of a power grid 200 in accordance with an embodiment of the present invention.

Additionally, in an embodiment, the present invention provides the flexibility of removing individual power and ground bumps without increasing voltage drops or modifying the overall power and ground bump structure. For instance, FIG. 4 illustrates a cross-sectional view of another embodiment of power grid 200 where bumps 204b and 216b have been removed. This would be useful when an individual bump is, for example, over an Alpha sensitive circuit. This is especially valuable because nearly all bumps may contain lead (lead emits Alpha particles). In a further embodiment, a widened metal may be utilized to compensate for the voltage drop associated with removing a bump. In addition, LRLIPS, in accordance with one embodiment of the present invention, does not impact the yield or the manufacturability of the VLSI chip. According, LRLIPS, in accordance with an embodiment of the present invention, may allow an IC to perform faster, reduce the overall IC power consumption, and/or provide some combination of these performance and power benefits.

$$L_{total} = L_1 + L_2 - (2 * L_{mutual}) \quad \text{(Formula 1)}$$

In Formula 1, $L_1$ and $L_2$ are the inductances associated with circuits 1 and 2, $L_{mutual}$ is the mutual inductance of circuits 1 and 2, and $L_{total}$ is the total inductance for circuits 1 and 2). In an embodiment, the circuits 1 and 2 may be adjacent power and ground buses, respectively. It is also envisioned that the total inductance may be reduced by lowering the inductance of each circuit. For example, in an embodiment, the power and/or ground buses may be made wider in width and/or shorter in length. However, depending on the available floor space and/or associate costs, it may be more desirable to reduce the total inductance ($L_{total}$) by increasing the mutual inductance ($L_{mutual}$). Accordingly, in an embodiment, it is desirable to decrease the gap between paired power and ground buses without causing a short and/or negatively affecting the signal carrying capabilities of the adjacent buses (for example, through varying electrical fields associated with the adjacent buses and the like). In such an embodiment, it is envisioned that the inductance of a power and ground grid is lowered without changing the resistance associated therewith.

As illustrated in FIG. 2, the bumps from different power buses may be substantially aligned (for example, vertically), in an embodiment. For example the bump 204a of the first power bus 202 may be aligned with the bump 208a of the second power bus 206. Similarly, in an embodiment, the bumps from the ground buses may be aligned. For example, the bump 212b of the first ground bus 210 may be aligned with the bump 216b of the second ground bus 214. In an embodiment, the bumps of a power bus may be equidistance from bumps of an adjacent ground bus. For example, the distance from the bump 204a to the bumps 212a and 212b may be substantially equal. Similarly, in an embodiment, the bumps of a ground bus may be substantially equidistance from bumps of an adjacent power bus. For example, the distance from the bump 212b to the bumps 204a and 204b may be substantially equal.

Figure 3:
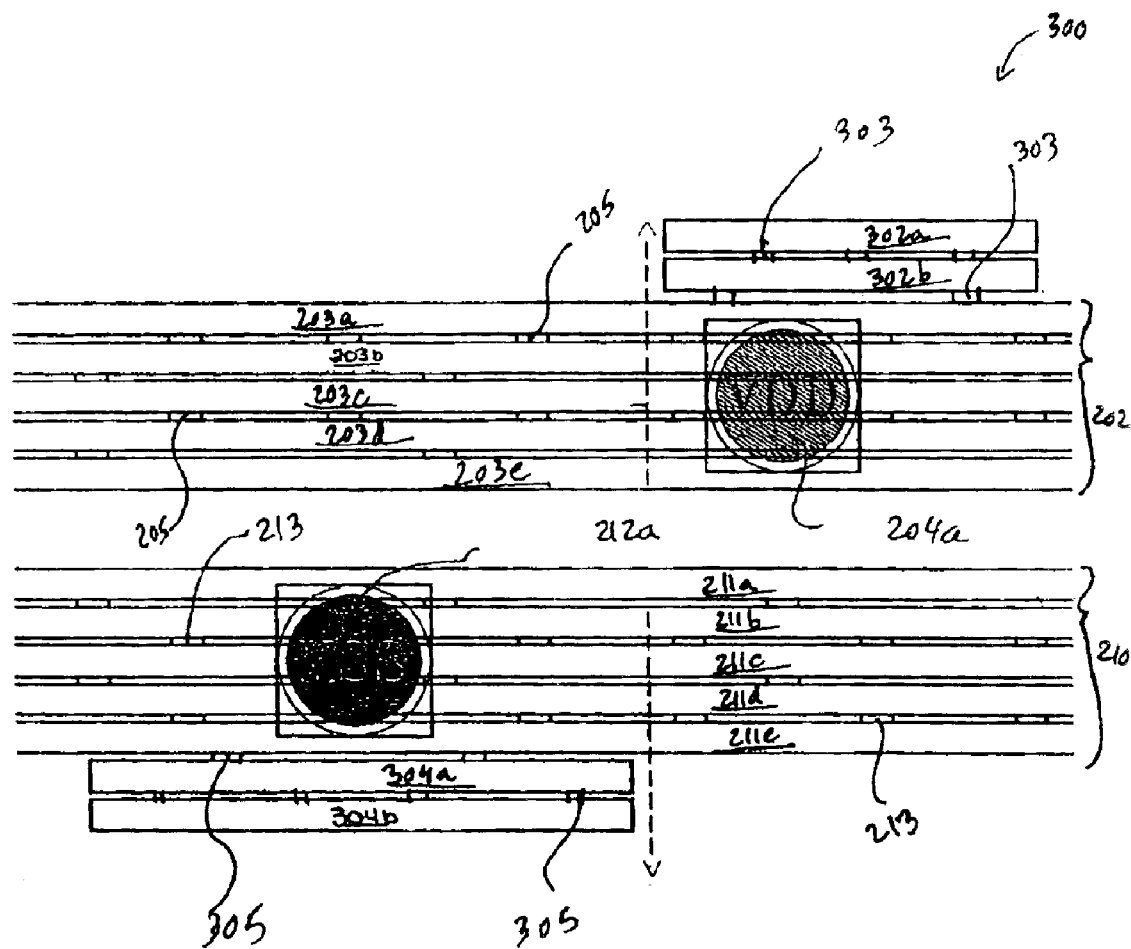
FIG. 3 illustrates an exemplarily cross-sectional view of an extended power grid 300 in accordance with an embodiment of the present invention.

FIG. 3 illustrates an exemplarily cross-sectional view of an extended power grid 300 in accordance with an embodiment of the present invention. The power grid 300 includes a first power bus 202 having a bump 204a and wires 203a–e. The power grid 300 further includes a first ground bus 210 having a bump 212a and wires 211a–e. As illustrated, the bumps 204a and 212a may not be vertically aligned (such as discussed with respect to FIG. 2). In an embodiment, the wires within each set of wires (203a–e and 211a–e) may be separated with any type of dielectric. As illustrated in FIG. 3, in accordance with one embodiment, the wires (e.g., 203a–e and 211a–e) may be electrically coupled by, for example, utilizing connectors 205 and 213 (shown throughout wires 203a–e and 211a–e, respectively). In another embodiment, it is envisioned that the wires 203a–e and 211a–e may each be a single wire (e.g., 203 and 211). It is also envisioned that process limitations may require a set of wires instead of a single wire.

In a further embodiment, it is envisioned that these connectors (e.g., 205 and/or 213) may be an integral part of the wires (e.g., 203a–e and/or 211a–e), instead of a separate structure. In one embodiment, the wires (e.g., 203a–e and/or 211a–e) and/or connectors (e.g., 205 and/or 213) may be constructed utilizing the same material. In an embodiment, the wires (e.g., 203a–e and/or 211a–e) and/or connectors (e.g., 205 and/or 213) may be constructed by using material selected from a group including copper, aluminum, silver, gold, other types of conductive substances, and/or any combination thereof.

The power grid 300 additionally includes extended wires 302a–b and 304a–b. As illustrated in FIG. 3, in accordance with one embodiment, the wires (e.g., 302a–b and 203a–e) may be electrically coupled by, for example, utilizing connectors 303 (shown throughout wires 302a–b). Similarly, in accordance with one embodiment, the wires (e.g., 304a–b and 211a–e) may be electrically coupled by, for example, utilizing connectors 305 (shown throughout wires 304a–b). In an embodiment, it is envisioned that these connectors (e.g., 303 and/or 305) may be an integral part of the wires (e.g., 302a–b and/or 304a–b), instead of a separate structure. In another embodiment, the wires (e.g., 302a–b and/or 304a–b) and/or connectors (e.g., 303 and/or 305) may be constructed utilizing the same material. In yet another embodiment, the wires (e.g., 302a–b and/or 304a–b) and/or connectors (e.g., 303 and/or 305) may be constructed by using material selected from a group including copper, aluminum, silver, gold, other types of conductive substances, and/or any combination thereof.

It is envisioned that the set of wires 203a–e of the first power bus 202 may be extended (e.g., utilizing the extended wires 302a–b) on an opposite side from the first ground bus 210. And, the set of wires 211a–e may be extended (e.g., utilizing the extended wires 304a–b) on an opposite side from the first power bus 202. Such extension of the wire sets 203a–e and 211a–e by, for example, the extended wires 302a–b and 304a–b, respectively, will not cause shorting in embodiments where the wire sets are brought as close to each other as possible, in part, to reduce the total inductance (see, e.g., the discussion with respect to FIG. 2). The total inductance is reduced for one or both of the following two reasons: (1) the reduced self-inductance (e.g., by introducing wider conductance paths), and/or (2) the increased mutual inductance (see, e.g., FIG. 3). The effect is envisioned to provide a wider power and/or ground bus, depending on which bus(es) are widened by adding wires. Also, in accordance with one embodiment of the present invention, it is envisioned that the mutual inductance between, for example, the extended wires 304a–b and an adjoining power grid (not shown) may be increased, whereas the mutual inductance between the set of wires 211a–e and the adjoining power grid may be reduced.

Accordingly, in an embodiment of the present invention, wire sets may be extended by adding one or more wires on an opposite side of the wire set from the neighboring power/ground bus. For example, with respect to FIG. 2, if the second power bus 206 and the second ground bus 214 are considered as a pair of power and ground buses, then wire set 207a–e may be extended by adding wires on the opposite side from the second ground bus 214. Similarly, wires 215a–e may be extended by adding wires on the opposite side from the second power bus 206.

In one embodiment, the extension of the wire sets may result in reduction of resistance associated with the power and/or ground buses. The reduction in resistance may reduce the voltage variation due to DC, which is also known as the IR drop (where I is for current and R is for resistance and the multiplication of the two result in voltage in accordance with the Ohm's law, i.e., V=I*R). An advantage of LRLIPS, in accordance with an embodiment of the present invention, is that the power and ground grid has the ability to be adjusted to any resistance value without changing the bump pattern. For example, a power and ground grid with very little resistance may be designed, but such a design may leave very little room to route global signals.

Therefore, LRLIPS, in accordance with an embodiment of the present invention, permits striking of a right balance of power and ground resistance and global signal tracking. In addition, in an embodiment, localized power and ground grids may be adjusted so as to tune a given IC to have the same IR drop in all transistors without changing the power and ground bumps.

Furthermore, reduction in inductance of a power grid reduces the voltage variations due to AC, which is also known as L*(di/dt) (where L stands for inductance and di/dt indicates the rate of change in current (i) over time (t)). The di/dt is largely determined by the architecture, frequency, and power of an IC. The inductance, L, may be reduced with LRLIPS, in accordance with an embodiment of the present invention, since the power and ground grids are so close and tightly coupled together (see, e.g., the discussion with respect to FIG. 2). It is envisioned that, in an embodiment, having a lower inductance power and ground grid will reduce voltage variations due to variations of current with respect to time. These current variations may be difficult to predict and estimate in cases where they are dependant on instruction and data patterns. Thus, by reducing the inductance (L) of a given power and ground grid, certain embodiments of the present invention dampen the effects of large current variations, thereby reducing large voltage variations, which in turn improves reliability and circuit performance.

It is envisioned that in an embodiment having a stable and predictable voltage at all transistors is paramount in achieving maximum performance and minimum power consumption. In addition, having a stable and predictable voltage at all transistor will increase reliability of an IC (e.g., if not enough guard band was allotted for voltage variation in the power budget estimates).

Additionally, in an embodiment, the present invention provides the flexibility of removing individual power and ground bumps without increasing voltage drops or modifying the overall power and ground bump structure. This would be useful when an individual bump is, for example, over an Alpha sensitive circuit. This is especially valuable because nearly all bumps may contain lead (lead emits Alpha particles). In a further embodiment, a widened metal may be utilized to compensate for the voltage drop associated with removing a bump. In addition, LRLIPS, in accordance with one embodiment of the present invention, does not impact the yield or the manufacturability of the VLSI chip. According, LRLIPS, in accordance with an embodiment of the present invention, may allow an IC to perform faster, reduce the overall IC power consumption, and/or provide some combination of these performance and power benefits.

Moreover, an IC may perform faster by having the minimum voltage at the transistors that is higher, so the transistor would switch faster at the low voltage corner. In particular, the minimum voltage would be higher since the budget for AC and DC voltage drops will be lower (i.e., Vtran=Vsupply−Vac_drop−Vdc_drop, where Vtran is the voltage at the transistor, Vsupply is the supply voltage, Vac_drop is the voltage associated with an AC drop, and Vdc_drop is the voltage associated with a DC drop). Alternately, in an embodiment, the voltage at the transistor may be left the same (e.g., resulting in the same performance) and the Vsupply lowered to reduce the overall power consumption.

Accordingly, in one embodiment, the bump pattern may be diagonal to reduce cheesing of package power planes. Thus, reducing resistance (R) and inductance (L) on, for example, a ceramic package. Such an embodiment is envisioned to also reduce the overall voltage drops.

The foregoing description has been directed to specific embodiments. It will be apparent to those with ordinary skill in the art that modifications may be made to the described embodiments, with the attainment of all or some of the advantages. For example, the embodiments of the present invention may be applied equally well to any device with a power and/or ground grid. Therefore, it is the object of the appended claims to cover all such variations and modifications as come within the spirit and scope of the embodiments of the present invention.

What is claimed is:

1. An apparatus comprising:
 a first power bus having a first set of power bumps;
 a first ground bus having a first set of around bumps, the first ground bus adjacent to the first power bus and forming a first bus pair with the first power bus;
 a second power bus having a second set of power bumps;
 a second ground bus having a second set of around bumps, the second ground bus adjacent to the second power bus and forming a second bus pair with the second power bus; and
 a wire extending the width of the first power bus on a side of the first power bus opposite from the first ground bus.

2. The apparatus of claim 1 wherein the first power bus and the first ground bus are located as close as possible to each ocher without causing an electrical short.

3. The apparatus of claim 1 wherein the apparatus provides reduction in inductance associated with the power and the ground buses.

4. The apparatus of claim 1 wherein the first power bus includes a plurality of wires coupled between the power bumps.

5. The apparatus of claim 1 wherein the first ground bus includes a plurality of wires coupled between the ground bumps.

6. The apparatus of claim 1 wherein the wire reduces at least one of a resistance and inductance associated with the first power bus.

7. The apparatus of claim 1 wherein the distance between the first power bus and the first ground bus is 30 microns.

8. An apparatus comprising:
a first power bus having a first set of power bumps;
a first around bus having a first set of around bumps, the first around bus adjacent to the first power bus and forming a first bus pair with the first power bus;
a second power bus having a second set of power bumps;
a second around bus having a second set of ground bumps, the second ground bus; adjacent to the second power bus and forming a second bus pair with the second power bus; and
a wire extending the width of the first ground bus on a side of the first around bus opposite from the first power bus.

9. The apparatus of claim 8 wherein the first power bus includes a plurality of wires coupled between the power bumps.

10. The apparatus of claim 8 wherein the first around bus includes a plurality of wires coupled between the ground bumps.

11. The apparatus of claim 8 wherein the wire reduces a resistance associated with the first ground bus.

12. The apparatus of claim 11 wherein each power bump is substantially equidistant from any immediately neighboring ground bump of the first ground bus and each ground bump is substantially equidistant from any immediately neighboring power bump.

13. The apparatus of claim 8 wherein an individual bump is removed without increasing a voltage drop associated with the bus that would have included the removed bump.

14. The apparatus of claim 8 wherein the power and ground buses are adjusted to a selected resistance value without changing a location of the plurality of the power and ground bumps.

15. The apparatus of claim 8 wherein the plurality of power bumps contain lead.

16. The apparatus of claim 8 wherein the plurality of ground bumps contain lead.

17. The apparatus of claim 12 wherein the distance associated with the substantially equidistant bumps is determined by the semiconductor process utilized to provide the apparatus.

18. The apparatus of claim 13 wherein the removed bump is located over an alpha sensitive circuit.

19. The apparatus of claim 13 wherein at least one metal from the bus is widened to compensate for a voltage drop associated with removing the bump.

20. An apparatus comprising:
a first power bus including a first set of power bumps having a diagonal pattern;
a first ground bus including a first set of around bumps, the first ground bus adjacent to the first power bus and forming a first bus pair with the first power bus;
a second power bus including a second set of power bumps having a diagonal pattern; and
a second ground bus including a second set of ground bumps, the second ground bus adjacent to the second power bus and forming a second bus pair with the second power bus;
a wire extending the width of the first ground bus on a side of the first ground bus opposite from the first power bus.

21. The apparatus of claim 20 wherein the first power bus and the first ground bus are located as close as possible to each other without causing an electrical short.

22. The apparatus of claim 20 wherein the apparatus provides reduction in inductance associated with the power and the ground buses.

23. The apparatus of claim 20 wherein the first power bus includes a plurality of wires coupled between the power bumps.

24. The apparatus of claim 20 wherein each power bump is substantially equidistant from any immediately neighboring ground bump of the first ground bus and each ground bump is substantially equidistant from any immediately neighboring power bump.

25. The apparatus of claim 20 wherein the power and ground buses are adjusted to a selected resistance value without changing a location of the plurality of the power and ground bumps.

26. The apparatus of claim 21 wherein the distance between the first power bus and the first ground bus is 30 microns.

27. The apparatus of claim 23 wherein the first ground bus includes a plurality of wires coupled between the ground bumps.

28. The apparatus of claim 24 wherein the distance associated with the substantially equidistant bumps is determined by the semiconductor process utilized to provide the apparatus.

* * * * *